US009749125B2

(12) United States Patent
Khan et al.

(10) Patent No.: US 9,749,125 B2
(45) Date of Patent: Aug. 29, 2017

(54) APPARATUS AND METHOD FOR CLOCK GENERATION

(71) Applicant: Analog Devices Global, Hamilton (BM)

(72) Inventors: Muhammad Kalimuddin Khan, Rochestown (IE); Kenneth J. Mulvaney, Coolaney (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/568,818

(22) Filed: Dec. 12, 2014

(65) Prior Publication Data

US 2016/0173272 A1  Jun. 16, 2016

(51) Int. Cl.
| | |
|---|---|
| *H04L 7/00* | (2006.01) |
| *H04L 7/04* | (2006.01) |
| *H03L 7/00* | (2006.01) |
| *H04L 7/033* | (2006.01) |
| *H04L 27/00* | (2006.01) |
| *H03L 7/07* | (2006.01) |

(52) U.S. Cl.
CPC ............. *H04L 7/04* (2013.01); *H03L 7/00* (2013.01); *H03L 7/07* (2013.01); *H04L 7/033* (2013.01); *H04L 27/00* (2013.01)

(58) Field of Classification Search
CPC .................................................. H03L 2207/50
USPC ........................................................ 375/365
See application file for complete search history.

(56) References Cited

U.S. PATENT DOCUMENTS

| | | |
|---|---|---|
| 5,052,026 A | 9/1991 | Walley |
| 6,711,228 B1 | 3/2004 | Kato et al. |
| 7,352,831 B2 | 4/2008 | Quinlan et al. |
| 7,719,368 B1 | 5/2010 | Smith et al. |
| 7,995,698 B2 | 8/2011 | Liu et al. |
| 8,509,371 B2 | 8/2013 | Kenney |
| 8,526,559 B2 | 9/2013 | Chao et al. |
| 2002/0150172 A1 | 10/2002 | Yang et al. |
| 2002/0186159 A1* | 12/2002 | Reinhold .................. H03L 7/00 341/155 |
| 2003/0107442 A1* | 6/2003 | Staszewski ............. H03L 7/085 331/1 A |

(Continued)

FOREIGN PATENT DOCUMENTS

WO    WO2005086407    9/2005

OTHER PUBLICATIONS

Murphy and Slattery, "All About Direct Digital Synthesis," *Analog Dialogue*, vol. 38, Issue 08, pp. 1-5, Aug. 2004.

(Continued)

*Primary Examiner* — Sam K Ahn
*Assistant Examiner* — Fabricio R Murillo Garcia
(74) *Attorney, Agent, or Firm* — Knobbe Martens Olson & Bear LLP

(57) ABSTRACT

A clock and data recovery (CDR) system may use one or more clock signals in sync with recovered data rate. By accumulating a dithering tuning counter value at a data oversampling rate, a plurality of single bit signals at multiples of the recovered data rate and in sync with the recovered data rate can be accurately generated while utilizing the full range of the accumulator. This plurality of clock signals can be used in various modules in the CDR system and other modules in a transceiver system incorporating the CDR system.

21 Claims, 11 Drawing Sheets

(56) References Cited

U.S. PATENT DOCUMENTS

| | | |
|---|---|---|
| 2006/0176940 A1 | 8/2006 | Chen |
| 2007/0117521 A1* | 5/2007 | Kuiri ................. H03J 1/005 |
| | | 455/76 |
| 2007/0164835 A1 | 7/2007 | Co |
| 2007/0230966 A1* | 10/2007 | Walsh ............. H04B 10/671 |
| | | 398/155 |
| 2008/0137790 A1 | 6/2008 | Cranford et al. |
| 2008/0147338 A1* | 6/2008 | Pavlath et al. ............ 702/66 |
| 2009/0302951 A1* | 12/2009 | Ballantyne ................ 331/16 |
| 2010/0019855 A1 | 1/2010 | Barrow et al. |
| 2011/0068828 A1 | 3/2011 | Anderson et al. |
| 2011/0075782 A1* | 3/2011 | Zhang ................. H03L 7/193 |
| | | 375/376 |
| 2011/0095830 A1* | 4/2011 | Tsangaropoulos ...... G06F 1/025 |
| | | 331/34 |
| 2012/0051402 A1 | 3/2012 | Cheng et al. |
| 2013/0034352 A1 | 2/2013 | Liu |
| 2013/0077188 A1* | 3/2013 | Grundvig .................. 360/51 |
| 2014/0240004 A1* | 8/2014 | Fawley ............. G06F 1/0335 |
| | | 327/106 |

OTHER PUBLICATIONS

Cronin, "DDS Devices Generate High-Quality Waveforms Simply, Efficiently, and Flexibly," *Analog Dialogue*, vol. 46, Issue 01, pp. 1-5, Jan. 2012.

Extended European Search Report in Application No. 15159085.8, dated Sep. 2, 2015.

\* cited by examiner

APPARATUS AND METHOD FOR CLOCK GENERATION

BACKGROUND

Field

The invention generally relates to electronics, in particular, to clock generation.

Description of the Related Art

Electronic systems such as transceivers and receivers may have a system clock signal based on a crystal at a fixed frequency yet may use multiple clock signals of various frequencies. Furthermore, as transceivers perform functions such as clock and data recovery (CDR), clock signals of multiples of the data rate may provide diversity and data rate-compatibility in clock signals for further processing in such an electronic system.

SUMMARY

One embodiment includes an apparatus comprising a dithering circuit configured to repeatedly switch between a first value and a second value to generate a tuning word, wherein the dithering circuit is configured to switch at a first clock frequency from a first clock signal, wherein the first clock signal is generated from a clock and data recovery (CDR) system, and an accumulator configured to add the tuning word and a previous accumulator output value to generate a new accumulator output value at a second clock frequency from a second clock signal, wherein the second clock signal is generated from a crystal oscillator.

Another embodiment includes a method for clock generation comprising generating a first clock signal; receiving a second clock signal, switching repeatedly between a first value and a second value to generate a tuning word, wherein the switching occurs at a first clock frequency from the first clock signal, and adding the tuning word and a previous accumulator output value to generate a new accumulator output value at a second clock frequency from the second clock signal.

Another embodiment includes an apparatus for clock generation, the apparatus comprising a means for generating a first clock signal, a means for switching repeatedly between a first value and a second value to generate a tuning word, wherein the switching occurs at a first clock frequency from the first clock signal, and a means for adding the tuning word and a previous accumulator output value to generate a new accumulator output value at a second clock frequency from a second clock signal.

BRIEF DESCRIPTION OF THE DRAWINGS

These drawings and the associated description herein are provided to illustrate embodiments of the invention and are not intended to be limiting.

DETAILED DESCRIPTION

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to cover such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

A clock and data recovery (CDR) system communicates data without a separate clock signal. Rather, the clock signal is embedded with the data stream and the CDR recovers the clock signal while receiving data. By accumulating a dithering tuning counter value at a data oversampling rate, a plurality of single bit signals at multiples of the recovered data rate and synchronous with the data stream can be accurately generated while utilizing the full range of the accumulator. This plurality of clock signals can be used in various modules in the CDR system and other modules in a transceiver system incorporating the CDR system.

Figure 1A:
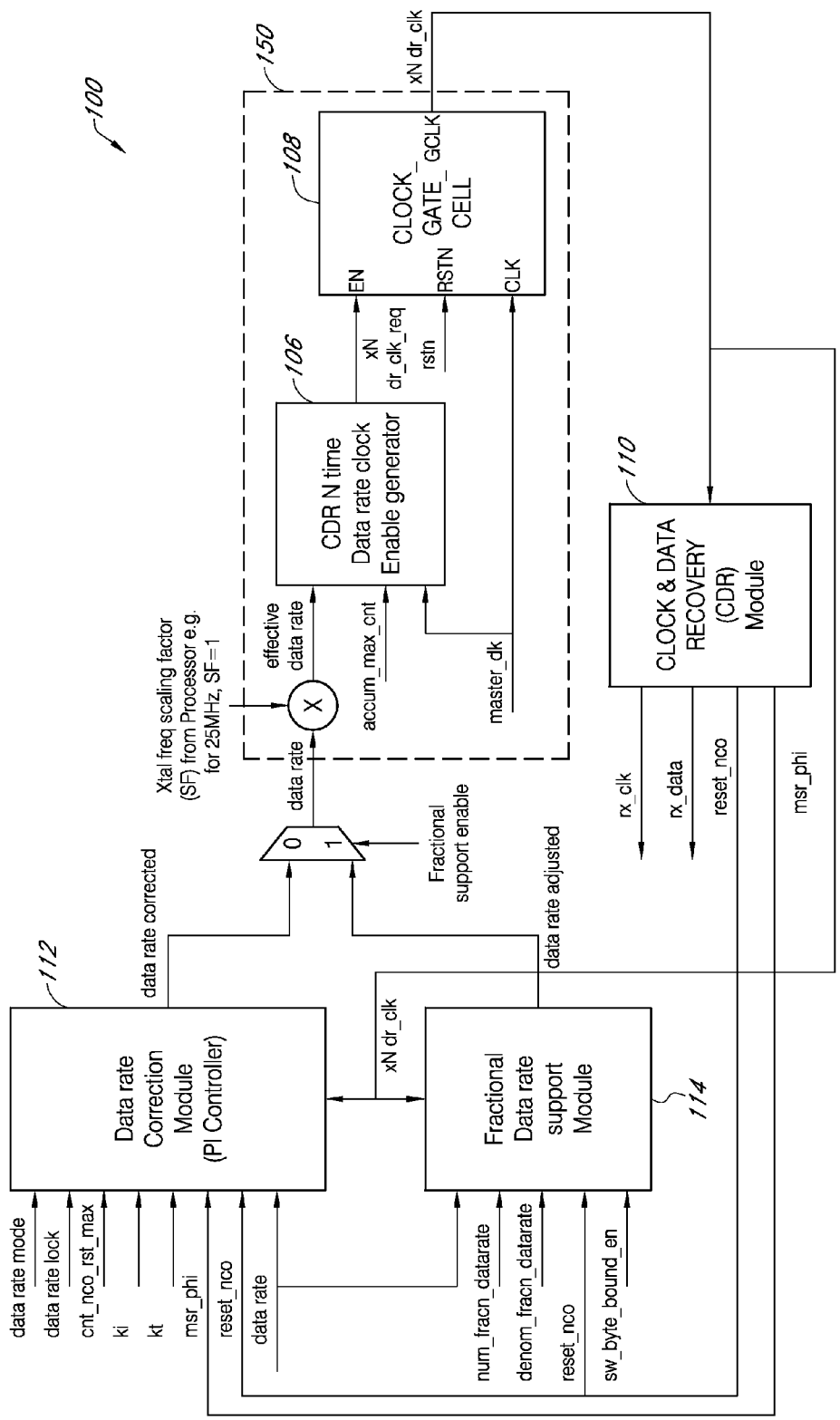
FIG. 1A is a schematic block diagram illustrating an example clock and data recovery (CDR) system including an example clock generation system according to one embodiment.

Referring to FIG. 1A, a schematic block diagram illustrating an example clock and data recovery (CDR) system including an example clock generation system will be described below. The illustrated system 100 includes a CDR module 110, a data rate correction module 112, a fractional data rate support module 114, and a clock generation system 150. The clock generation system 150 may include a CDR clock enable generator 106 and a clock gate cell 108. The system 100 may be implemented within systems such as a networking device to acquire and track a data stream that is modulated by one of various modulation schemes. Example modulation schemes include 2-FSK, or binary FSK, 3-FSK, or ternary FSK, and 4-FSK depending on the number of digital levels represented in discrete frequencies. The system 100 may also have a system clock signal, master_clk, based on the frequency of a crystal providing clock signals to the CDR clock enable generator 106 and the clock gate cell 108, for example. In some embodiments, other circuits such as oversampling filters, demodulators, or serializers may be used instead of the CDR module 110 as also described in FIG. 1B below.

The CDR module 110 performs clock and data recovery. The CDR module 110 may receive, among others, the ×N dr_clk signal generated by the clock generation system 150. In some embodiments, the CDR module 110 may be configured to receive a plurality of ×N dr_clk signals having different frequencies, such as data rate ×32, data rate ×64, etc. The CDR module 110 may include various internal modules for clock and data recovery. The CDR module 110 may have a CDR numerically controlled oscillator (NCO) that performs clock recovery. The CDR NCO may receive, among others, a data sequence, and generate a rx_clk signal and a rx_data signal, which are outputs of the CDR module 110. The rx_clk signal is a recovered clock signal in sync with the data sequence, and the rx_data signal is a recovered data signal based on the data sequence. The rx_clk signal may be generated by generating a clock signal of 50% duty cycle based on an internal counter value of the CDR NCO. For example, the rx_clk signal may be set low for the first half of the CDR NCO counter period and high for the second half of the CDR NCO counter period.

The CDR module 110 may further include additional modules such as phase detection and reset modules, PLL filter, and/or modular signal acquisition and detection modules operating in conjunction with the CDR NCO. The CDR module 110 may output a reset_nco signal and a msr_phi signal as necessary for the phase detection and reset modules, for example. In some embodiments, and the internal counter of the CDR NCO of the CDR module 110 may be programmed, reset, and/or adjusted as the CDR module 110 and the additional modules discussed above operate in conjunction with the data rate correction module 112 and the fractional data rate support module 114, whose features are further described below.

The data rate correction module 112 can adjust a programmed data rate according to an incoming data rate. The data rate correction module 112 takes in, among others, a phase signal, gain parameters such as ki and kt, and a data rate signal as illustrated in FIG. 1A. In some embodiments, the data rate correction module 112 may include an accumulator, a proportional controller, and an integral controller. The accumulator receives the phase signal, msr_phi, and accumulates the phase signal to create an error signal. The error signal then goes through a proportional-integral (PI) controller to generate a data rate adjustment value, where the proportional and integral controllers have the gain parameters of as ki and kt. The data rate adjustment value is added to the data rate signal to generate a data rate corrected signal, which is an output of the data rate correction module 112. In one embodiment, the data rate correction module 112 may also have a scaling block to generate a scaling value to be added to the main data rate register to obtain a corrected data rate value, and the data rate adjustment and the data rate signal can be summed to generate the data rate corrected signal to be outputted from the data rate correction module 112.

The fractional data rate support module 114 may provide support for data rates different from the programmed data rate by a fraction. In one embodiment, the fractional data rate support module 114 may include, among others, programmable numerator and denominator registers and an accumulator that accumulates a numerator value. The fractional data rate support module 114 may allow a CDR circuit that is designed to use a set unit step to approximate a target data rate that is not an integer multiple of the unit step rather than let the system accumulate fractional data rate errors over time. The numerator register may be set to the numerator of the fractional difference between the actual data rate and the programmable CDR data rate so that the adjusted data rate may alternate, or dither, between the programmed data rate and another value, such as the programmed data rate increased by one unit step. For example, the CDR system may be designed to use the unit step of 100 bps, and the target data rate may be 32768 bps. Without the fractional data rate support system, the CDR system would have to be programmed to use either 32700 bps or 32800 bps to approximate 32768 bps. Instead, the numerator register may be set at 68 and the denominator may be set at 100 in this example. The numerator value is accumulated over time, and the accumulated numerator value in excess of denominator value is calculated. Whenever the accumulated numerator value exceeds the denominator value the adjusted data rate is set at the programmed data rate increased by one unit step. Over time the data rate in the above example will be at 32800 bps for 68% of the time and 32700 bps for 32% of the time; thus, closely approximating 32768 bps. The description above regarding the fractional data rate support module 114 is only one embodiment of the alternating, or dithering, between two data rates to achieve a fractional data rate. The numbers of bits, for example, may be different from the example above; the two data rates, for example, may be more than one unit step apart; and the dithering, for example, may be accomplished in the opposite direction.

The clock generation system 150 can generate a clock signal N times the data rate. The clock generation system 150 may receive the data rate signal, which can be a corrected data rate by the data rate correction module 112 or an adjusted data rate by the fractional data rate support module 114. The clock generation system 150 may also receive a scaling factor from a processor (not shown) to multiply the data rate signal by to generate an effective data rate signal to be inputted to the CDR clock enable generator 106. In some implementations, a dedicated hardware block may perform the calculation instead of the processor. In some embodiments, the clock generation system 150 may not be configured to scale the incoming data rate, in which case, the effective data rate signal would be the same as the data rate signal. The clock generation system 150 may output the ×N dr_clk signal to the CDR module 110. The ×N dr_clk signal is a clock signal N times the effective data rate. In alternative embodiments, the CDR clock enable generators 106 and the clock gate cells 108 may be configured to generate a plurality of ×N dr_clk signals of different multiples of the effective data rate, such as ×16, ×32, ×64, etc. Further details of the clock generation system 150 is described in connection with FIG. 1C below.

Figure 1B:
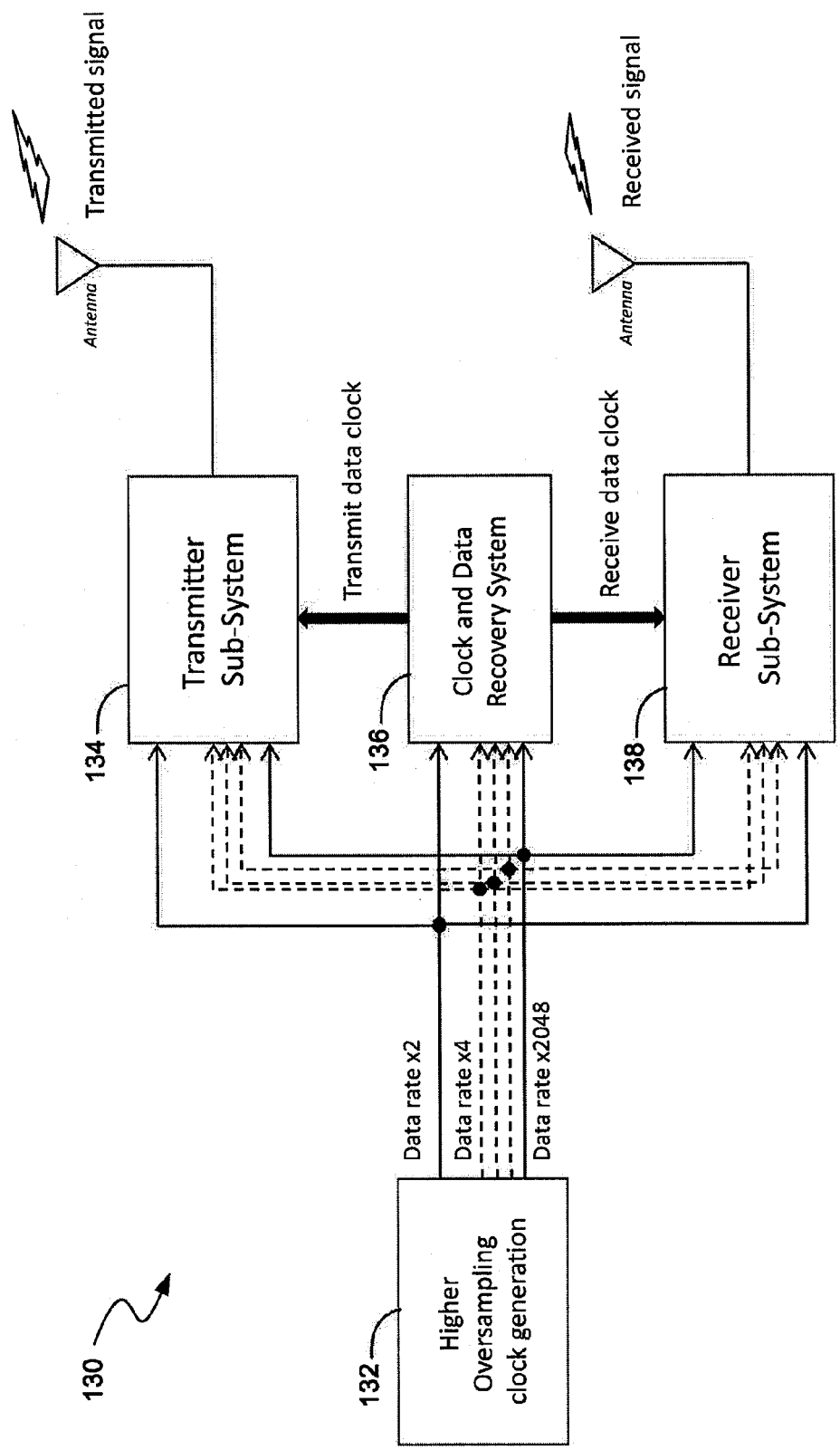
FIG. 1B is a schematic block diagram illustrating a transceiver system including another example clock generation system according to one embodiment.

Referring to FIG. 1B, a schematic block diagram illustrating a transceiver system including another example clock generation system will be described below. The illustrated transceiver system 130 includes an oversampling clock generation system 132, a clock and data recovery system 136, a transmitter sub-system 134, and a receiver sub-system 138. The oversampling clock generation system 132 may be implemented substantially similarly to the clock generation system 150 (FIGS. 1A, 1C) generating a plurality of the ×N dr_clk signals (FIG. 1A) at different multiples of the data rate or effective data rate. The oversampling clock generation system 132 may output a plurality of clock signals at multiples of the data rate (or effective data rate), such as "Data rate ×2," "Data rate ×4," . . . "Data rate ×2048" as illustrated in FIG. 1B to the clock and data recovery system 136. In some embodiments, the clock and data recovery system 136 may include modules such as the CDR module 110 (FIG. 1A), the data rate correction module 112 (FIG. 1A), the fractional data rate support module 114 (FIG. 1A), and other modules discussed in connection with FIG. 1A.

The transmitter sub-system 134 may receive a transmit data clock signal from the clock and data recovery system 136 and the plurality of clock signals from the oversampling clock generation system 132. The transmitter sub-system 134 may be configured to transmit signals with a transmit antenna as illustrated in FIG. 1B. Alternatively, the transmission channel can be a wire or optical fiber.

The receiver sub-system 138 may get a receive data clock signal from the clock and data recovery system 136 and the plurality of clock signals from the oversampling clock generation system 132. The receiver sub-system 138 may be configured to receive signals with, for example, a receive antenna as illustrated in FIG. 1B or via a wired or optical connection. The illustrated system 130 may have the benefit of having multiple clock signals generated by the clock and data recovery system 136 available for both the transmitter sub-system 134 and the receiver sub-system 138 using the clocked design disclosed herein. Furthermore, the multiple clock signals generated by the clock and data recovery system 136 may be used in other circuits, such as oversampling filters, demodulators, and serializers.

Figure 1C:
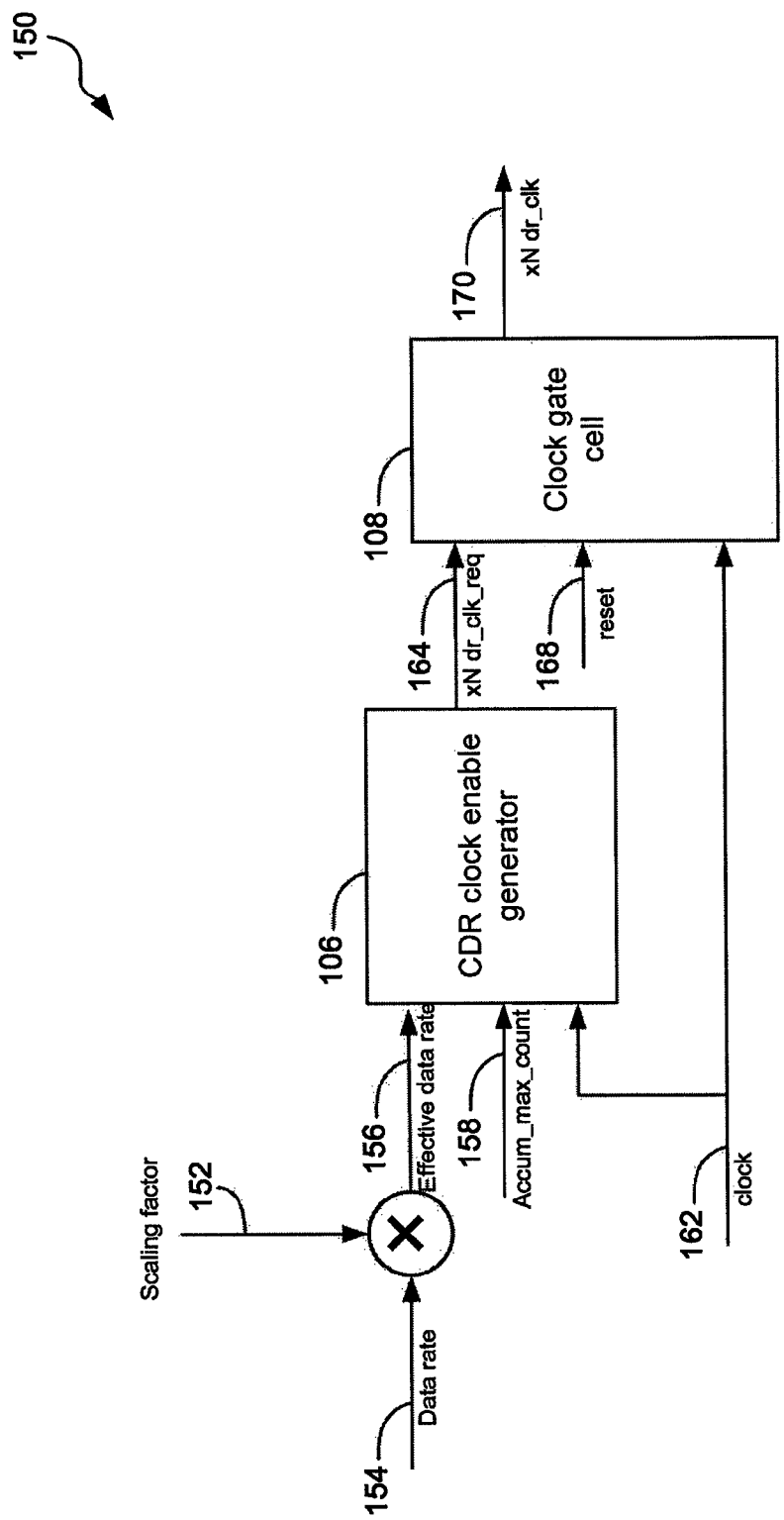
FIG. 1C is a schematic block diagram illustrating the example clock generation system of FIG. 1A.

Referring to FIG. 1C, a schematic block diagram illustrating the example clock generation system 150 of FIG. 1A will be described below. The clock generation system 150 may receive a scaling factor 152 from a processor (not shown) and a data rate 154 as illustrated in FIG. 1A. In some implementations, a dedicated hardware block may be used instead of the processor. An effective data rate 156 is generated from multiplication of the data rate 154 by the scaling factor 152. In some embodiments, the value of the scaling factor 152 may be one or the illustrated system 150 may omit the scaling features, and the data rate 154 and the effective data rate 156 can be the same. The CDR clock enable generator 106 may receive the effective data rate 156, an accumulator maximum count (accum_max_count) signal 158, and a clock signal 162. The clock enable generator 106 may output an N-time data rate required (×N dr_clk_req) signal 164 to the clock gate cell 108. The clock gate cell 108 may also receive a reset signal 168 and the clock signal 162. The reset signal 168 can asynchronously reset the flip-flops of the clock gate cell 108. The clock gate cell may generate the ×N dr_clk signal 170, which is outputted from the clock generation system 150, also as illustrated in FIG. 1A.

The scaling factor 152 may be used to adjust the data rate 154 to produce the effective data rate 156. The scaling factor 152 may be determined by the processor based in part on the system crystal frequency, the accumulator maximum count signal 158, and the programmability of the accumulator maximum count signal 158. For example, a 26 MHz crystal and a 18-bit accumulator may be used in one implementation, and the accumulator maximum count signal 158, which can function as a modulus for division, may be set at 260,000 in the implementation. In this example, instead of the 26 MHz crystal, a crystal of 52 MHz can be used with the scaling factor 152 set to ½ without further change in bit selection, for example. The scaling factor 152 can provide diversity in input crystal frequency as the scaling factor 152 can be used to adjust the data rate that is based on the crystal frequency. For instance, accumulator width increment of 1 at 26 MHz can result in the data rate of 100 bits per second (bps) in this example. In some embodiments, applying the scaling factor 152 can be performed with shift registers.

The CDR clock enable generator 106 may be implemented in various ways incorporating the features described in connection with FIGS. 2 and 3 below. Example implementations of the CDR clock enable generator 106 are further illustrated in FIGS. 4A-4C below. In some embodiments, the CDR clock enable generator 106 may output a plurality of ×N dr_clk_req signals 164 so that the clock generation system 150 may output a plurality of clock signals, ×N dr_clk, to other modules such as the modules illustrated in, and discussed in connection with FIGS. 1A-1B. Details about specific implementations of the CDR clock enable generator 106 are discussed below in connection with FIGS. 2-4C. In some embodiments, the plurality of features described in connection with FIGS. 2-4C below may be combined to implement the CDR clock enable generator 106.

The clock gate cell 108 may be configured to enable or disable a plurality of clock signals generated by the CDR clock enable generator 106 to reduce power consumption, for example. The clock gate cell 108 may receive a plurality of ×N dr_clk_req signals 164 and enable or disable each of the ×N dr_clk_req signals 164 as needed by the systems 100 (FIG. 1A) and 130 (FIG. 1B) incorporating the clock generation features disclosed herein.

Figure 2:
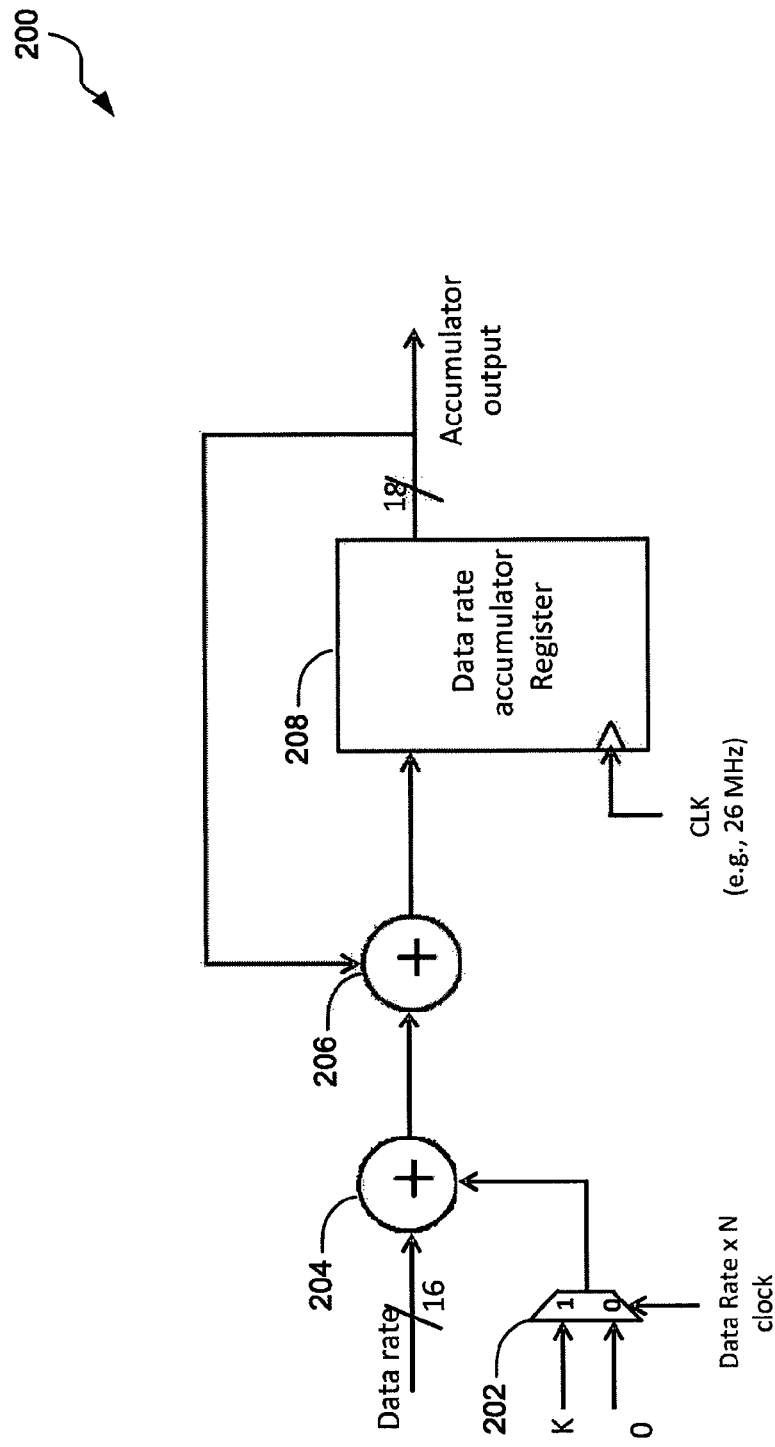
FIG. 2 is a schematic block diagram illustrating a part of an example clock generation system according to one embodiment.

Referring to FIG. 2, a schematic block diagram illustrating a part of an example clock generation system will be described below. The illustrated system 200 may be a part of an example implementation of the CDR clock enable generator 106 (FIGS. 1A, 1C). The illustrated system 200 includes a multiplexer 202, a tuning adder 204, an accumulator adder 206, and a data rate accumulator register 208. The system 200 receives a data rate or effective data rate signal as described in connection with FIGS. 1A and 1C, modifies the data rate or effective data rate signal through dithering to generate a tuning word, and accumulates the tuning word to generate an accumulator output. In one embodiment, as illustrated in FIG. 2, the system 200 may include a 16-bit data rate input and a 18-bit accumulator output, and in other embodiments, the data rate input and the accumulator output each may have a different number of bits than the ones illustrated in FIG. 2. The number of bits can vary in a very broad range.

The illustrated system 200 implements an accumulator with the accumulator adder 206 and the data rate accumulator register 208. The data rate accumulator register 208 also receives a system clock signal, which can be at the system crystal frequency, for example. As the data rate accumulator register 208 accumulates the input data rate value with every cycle of the clock signal, each bit value of the output of the data rate accumulator register 208 may have the frequency of multiples of the input data rate value. For example, if the input clock to the data rate accumulator register 208 is 26 MHz and the data rate is at 100 bps, the accumulator output will accumulate bits at the rate of 26 MHz/100 bps, which may generate counter values up to 260,000 per one bit assuming the register has enough number of bits. As such, a maximum count value, or a modulus, may be determined based on the input clock and the data rate. In the above example, the modulus can be set at 260,000. If the data rate accumulator register 208 has 18 bits, for example, the data rate accumulator register 208 may have the maximum count value of $2^{18}-1$, which is 262,143. In some embodiments, the maximum countable register value of the data rate accumulator register 208 may be a constant multiple of the modulus as the modulus may be a power of 2 (minus one). An implementation of such embodiments is discussed further in connection with FIG. 4C below. In other embodiments, the maximum countable register value of the data rate accumulator register 208 may not be a constant multiple of the counter values generated based on the data rate and clock frequency, in which case a dithering circuit and/or a counter value resetting circuit may be implemented. The counter value resetting circuit is described in connection with FIGS. 4A-4B below. The dithering circuit as illustrated in FIG. 2 is described below.

The illustrated system 200 implements the dithering circuit with the multiplexer 202 and the tuning adder 204. The multiplexer 202 may choose one of the two values, such as K and 0 as illustrated in FIG. 2. The value of K may be determined by the number of bits that the accumulator register 208 has and the system crystal frequency, CLK. For instance, an example implementation of the system 200 may have the data rate accumulator register 208 having 18 bits, the system crystal frequency of 26 MHz, and the data rate at 100 bits per second (bps). As in the previously discussed example, the counter may count up to 260,000 per one bit although the data rate accumulator register 208 has 18 bits that may count up to 262,143. When the modulus (e.g., 260,000) only uses part of the number scheme, which may range from 0 to $2^N-1$ (e.g., 262,143), it can be beneficial to distribute the accumulator numbers over the full range of the number scheme for the oversampling clock generation. To bring the per bit counter value, or modulus (e.g., 260,000), as close to the maximum countable register value (e.g., 262,143), an adjustment value K may be added to the data rate at the tuning adder 204. The adjustment value K may be added at the rate of the data rate times N (data rate ×N) as the multiplexer 202 receives the data rate ×N clock signal and dithers between K and 0. In this example, the adjustment value K may be 66 and the data rate ×N signal may be at the data rate ×32, in which case the counter may count up to 260,000+66×32=262,112, which is close to 262,143. As the difference between the modulus and the maximum countable register value is reduced, the full range of the data rate accumulator register 208 can be utilized with minimal error in output clock signals, for example. In other embodiments, a different adjustment value K and/or a different multiple N of the data rate may be used to further reduce the difference. In other embodiments, the counter resetting circuit, which is described in connection with FIGS. 4A-4B below, may be used instead of or in conjunction with the dithering circuit.

Figure 3:
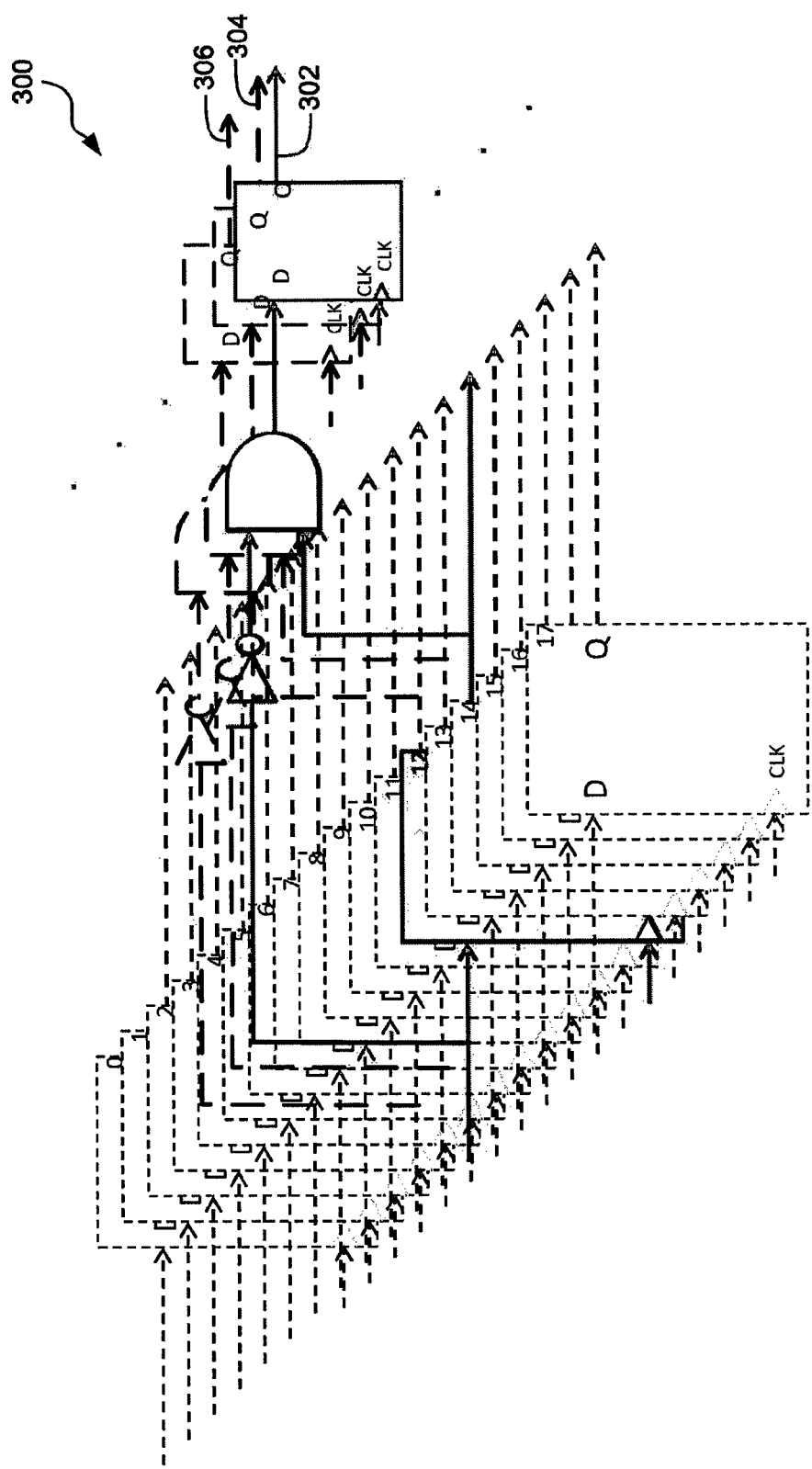
FIG. 3 is a schematic block diagram illustrating another part of an example clock generation system according to one embodiment.

Referring to FIG. 3, a schematic block diagram illustrating another part of an example clock generation system will be described below. The illustrated system 300 may be a part of an example implementation of the CDR clock enable generator 106 (FIGS. 1A, 1C). In one embodiment, as illustrated in FIG. 3, the system 300 may include an 18-bit accumulator having 18 registers for 18 bits labeled as 0 through 17 respectively. In another embodiment, an accumulator of the system 300 may have the number of bits different from the one illustrated in FIG. 3. The part of the example clock generation system illustrated in FIG. 3 may include a plurality of single bit registers and one or more logic circuits to generate one or more output clocks. In particular, the illustrated system 300 includes 18 single bit registers and three logic circuits, each of which comprises an inverter and an AND gate. The three logic circuits may function as edge detectors. In other embodiments, the number of single bit registers and the number of logic circuits may be different. In other embodiments the logic circuits, or edge detectors, may be implemented with circuit elements other than an inverter or an AND gate. The system 300 then outputs one or more clock signals, such as clock signals 302, 304, and 306, through one or more respective registers.

For ease of illustration, the system 300 shows three output clock signals 302, 304, and 306, and the system 300 may have more or less number of output clock signals. The clock signal 302, for example, is generated based on the current and previous 13th bit (from least significant bit, or LSB) values of an 18-bit register, such as the data rate accumulator register 208 (FIG. 2). The 13th bit (from the LSB) of the 18-bit register oscillates between 0 and 1 at the rate of 32 times the data rate because $2^{(18-13)}=2^5=32$. Similarly, the clock signal 304, for example, is generated based on the current and previous 12th bit (from the LSB) values of the 18-bit register. Therefore, the output clock signal 304 is at 64 times the data rate because $2^{(18-12)}=2^6=64$. Similarly, clock signal 306 is at 128 times the data rate, and as more logic circuits are added to more bits of the accumulator, the system 300 may theoretically generate the clock signal up to $2^n$ times the data rate, where n is the number of bits of the accumulator register minus one (e.g., 17 for 18-bit register). In embodiments that utilize the full range of the maximum countable accumulator register value (e.g., 262143 in the abovementioned example), all clocks based on the LSB to the most significant bit (MSB) may be accurately generated. In embodiments that do not utilize the full range of the maximum countable accumulator register value, output clocks up to a certain multiples of the data rate may be accurately generated with the system 300 in conjunction with the use of the dithering circuit described in connection with FIG. 2 above, for example.

Figure 4A:
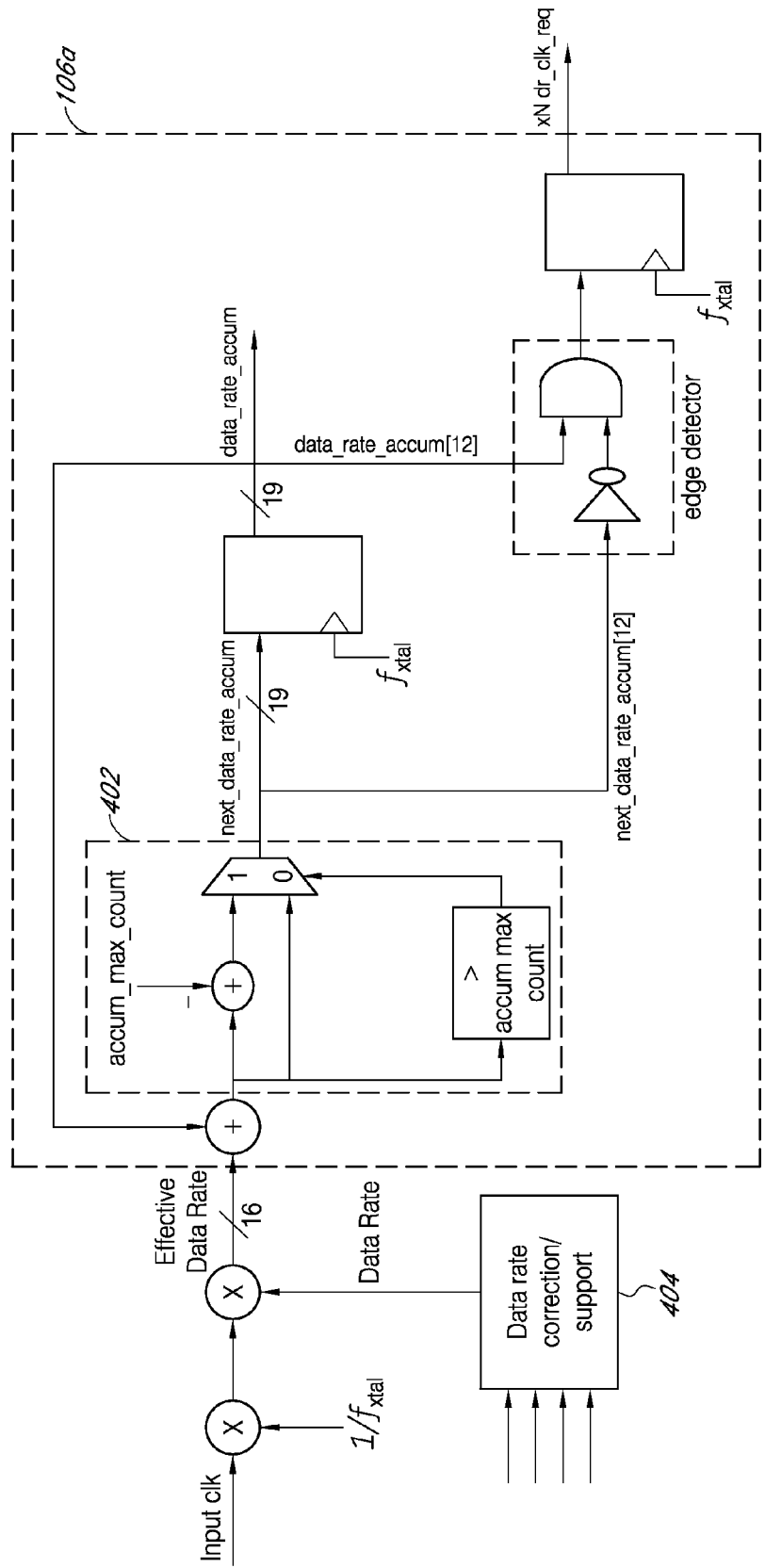
FIG. 4A is a schematic block diagram illustrating an example implementation of a clock generation system according to one embodiment.
Figure 4B:
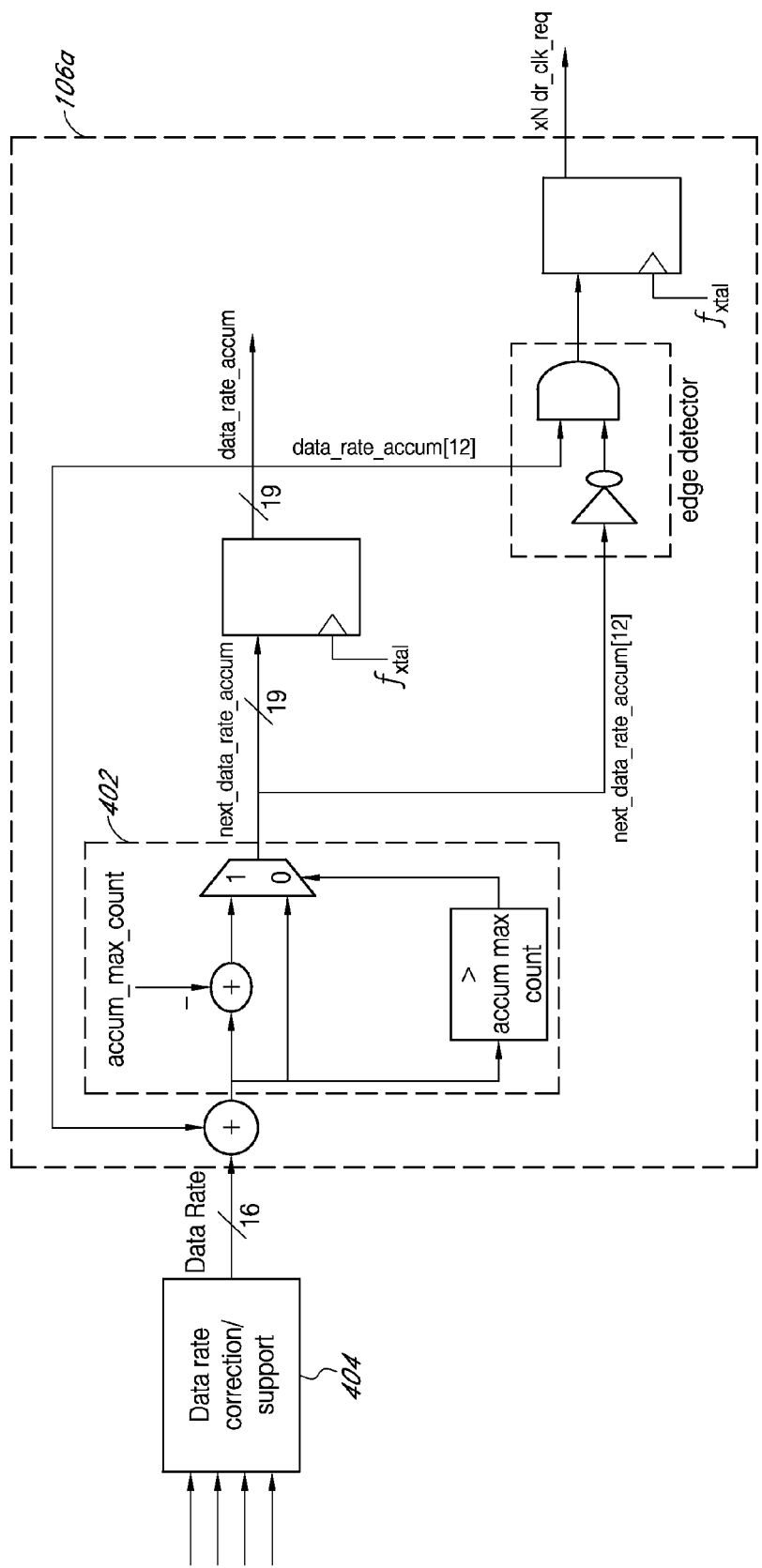
FIG. 4B is a schematic block diagram illustrating an example implementation of a clock generation system according to another embodiment.
Figure 4C:
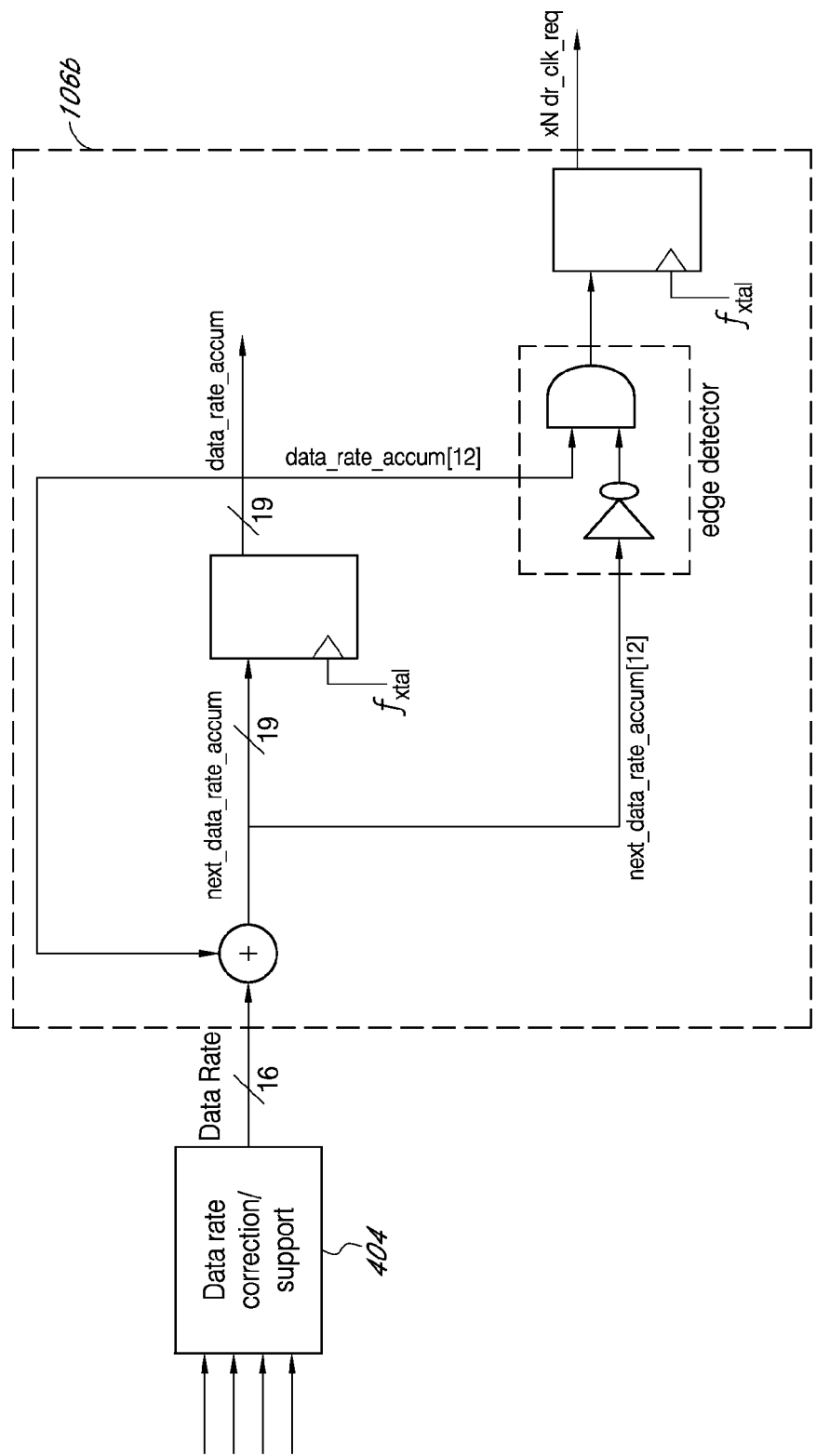
FIG. 4C is a schematic block diagram illustrating an example implementation of a clock generation system according to another embodiment.

FIGS. 4A-4C illustrate various example implementations of the clock generation system described herein. Although the illustrated systems in FIGS. 4A-4C include specific numbers of bits for certain signals, in other embodiments, the clock generation system described herein may be implemented with signals with numbers of bits different from the signals illustrated in FIGS. 4A-4C. In one embodiment, the systems illustrated in FIGS. 4A-4C may implement a constant modulus (e.g., 260,000) and a scalable clock input (e.g., by the factor of $1/f_{xtal}$). In another embodiment, the systems illustrated in FIGS. 4A-4C may implement a programmable modulus and a scalable clock input, in which case a maximum accumulator count value (accum_max_count) can be programmable. In another embodiment, the systems illustrated in FIGS. 4A-4C may implement a programmable modulus and a constant clock input.

Referring to FIG. 4A, a schematic block diagram illustrating an example implementation of a clock generation system will be described below. A clock enable generation system 106a may be an example implementation of the CDR clock enable generator 106 of FIGS. 1A, 1C. FIG. 4A includes the clock enable generation system 106a and a data rate correction/support module 404. The data rate correction/support module 404 may include one or more of the features of the data rate correction module 112 (FIG. 1) and the fractional data rate support module 114 (FIG. 1) discussed above. The system illustrated in FIG. 4A also includes scaling of an input clock signal, input clk, by the factor of $1/f_{xtal}$ generating an effective data rate signal based on the data rate signal from the data rate correction/support module 404. Determination of this factor may be similar to how the scaling factor is determined as discussed in connection with FIG. 1. The clock enable generation system 106a includes a counter resetting circuit 402, and the accumulator and logic features discussed in connection with FIGS. 2-3 above.

The counter resetting circuit 402 may have a constant modulus, or a maximum accumulator count value (accum_max_count). The counter resetting circuit 402 may also include a comparator and a multiplexer as illustrated in FIG. 4A to determine whether the accumulated data rate counter value is greater than the constant modulus. If the counter resetting circuit 402 determines that the accumulator counter value is greater than the constant modulus, the counter resetting circuit 402 may reset the accumulator counter value to zero. For example, if the data rate is 100 bps and the system crystal frequency is 26 MHz, the constant modulus of 260,000 can be selected. Assuming the accumulator in the clock enable generation system 106a has enough number of bits (e.g., at least 18 bits), the counter resetting circuit 402 may be configured to reset the accumulator counter to zero after the counter value reaches 260,000. As such, the illustrated system in FIG. 4A may implement a constant modulus and a scalable clock input.

Referring to FIG. 4B, a schematic block diagram illustrating another example implementation of a clock generation system will be described below. The system illustrated in FIG. 4B includes the clock enable generation system 106a and the data rate correction/support module 404 discussed in connection with FIG. 4A above. Unlike the illustrated system FIG. 4A, the clock enable generation system 106a of FIG. 4B receives the data rate signal from the data rate correction/support module 404 without scaling the data rate. As such, the illustrated system in FIG. 4B may implement a programmable modulus with a constant clock input.

Referring to FIG. 4C, a schematic block diagram illustrating another example implementation of a clock generation system will be described below. A clock enable generation system 106b may be another example implementation of the CDR clock enable generator 106 of FIGS. 1A, 1C. FIG. 4C includes the clock enable generation system 106b and the data rate correction/support module 404 discussed above in connection with FIGS. 4A-4B. The clock enable generation system 106b also includes the accumulator and logic features discussed in connection with FIGS. 2-3 above. The clock enable generation system 106b may implement a programmable modulus that is a power of two, and the clock enable generation system 106b may be implemented without the counter resetting circuit 402. When the modulus is a power of two, the registers in the clock generation system 106b would reset as the counter accumulates and reaches its maximum, and a resetting circuit may not be necessary.

Figure 5:
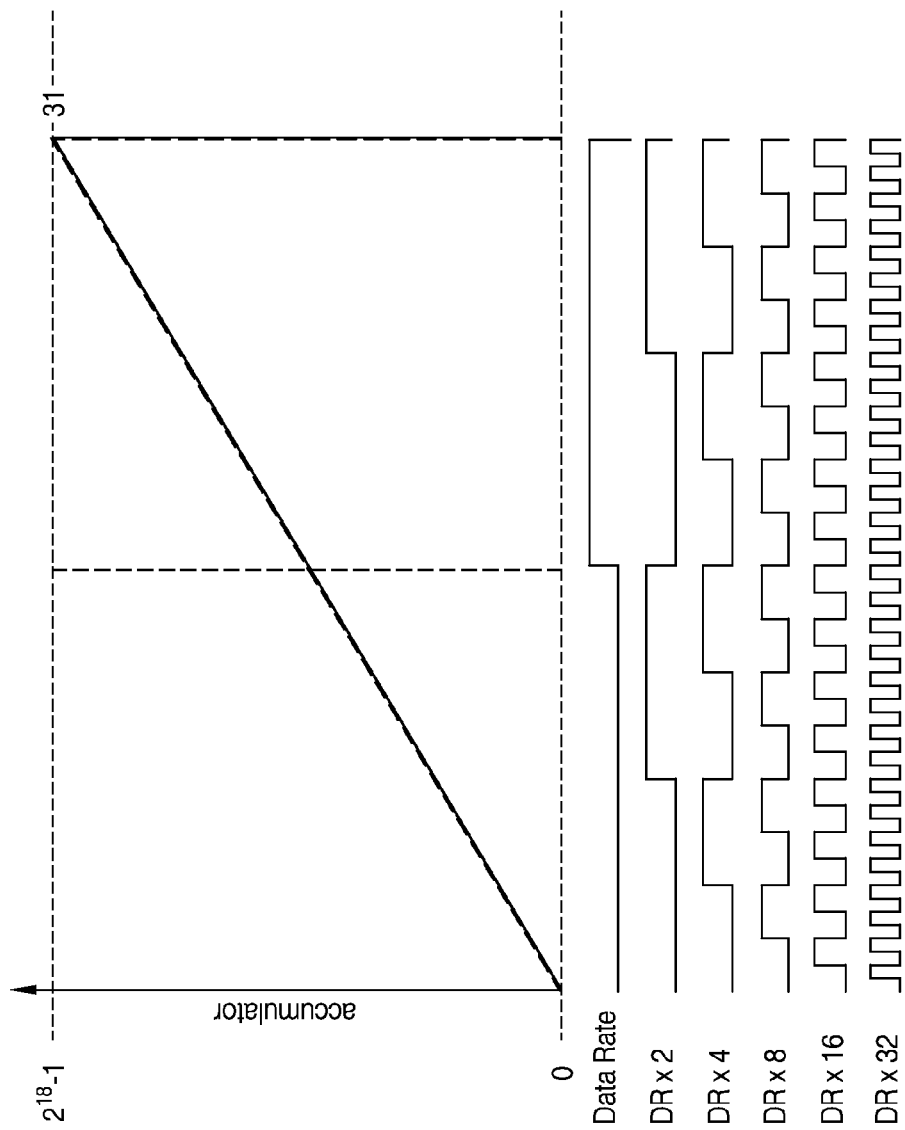
FIG. 5 is a timing diagram illustrating an example clock generation according to one embodiment.

Referring to FIG. 5, a timing diagram illustrating an example clock generation will be described below. The illustrated diagram shows an example implementation of the disclosure herein having a CDR NCO, similar to the one discussed in connection with FIG. 1A, running at 32 times the data rate and an accumulator adding the data rate at 26 MHz. In this example, as shown in the first line labeled "Data Rate," the time period shown in FIG. 5 is a one-bit period of the data signal, and during this period, the clock generation system disclosed herein accumulates up to about 262,000. Based on different bits of the accumulator as discussed above, multiple clock signals of multiples of the data rate can be generated. In this example, based on the 13th bit of a 18-bit register, a clock signal at 32 times the data rate labeled as "DR×32" can be generated. Similarly, clock signals at other multiples of the data rate can be generated based on different bits of the accumulator as shown in FIG. 5.

Figure 6:
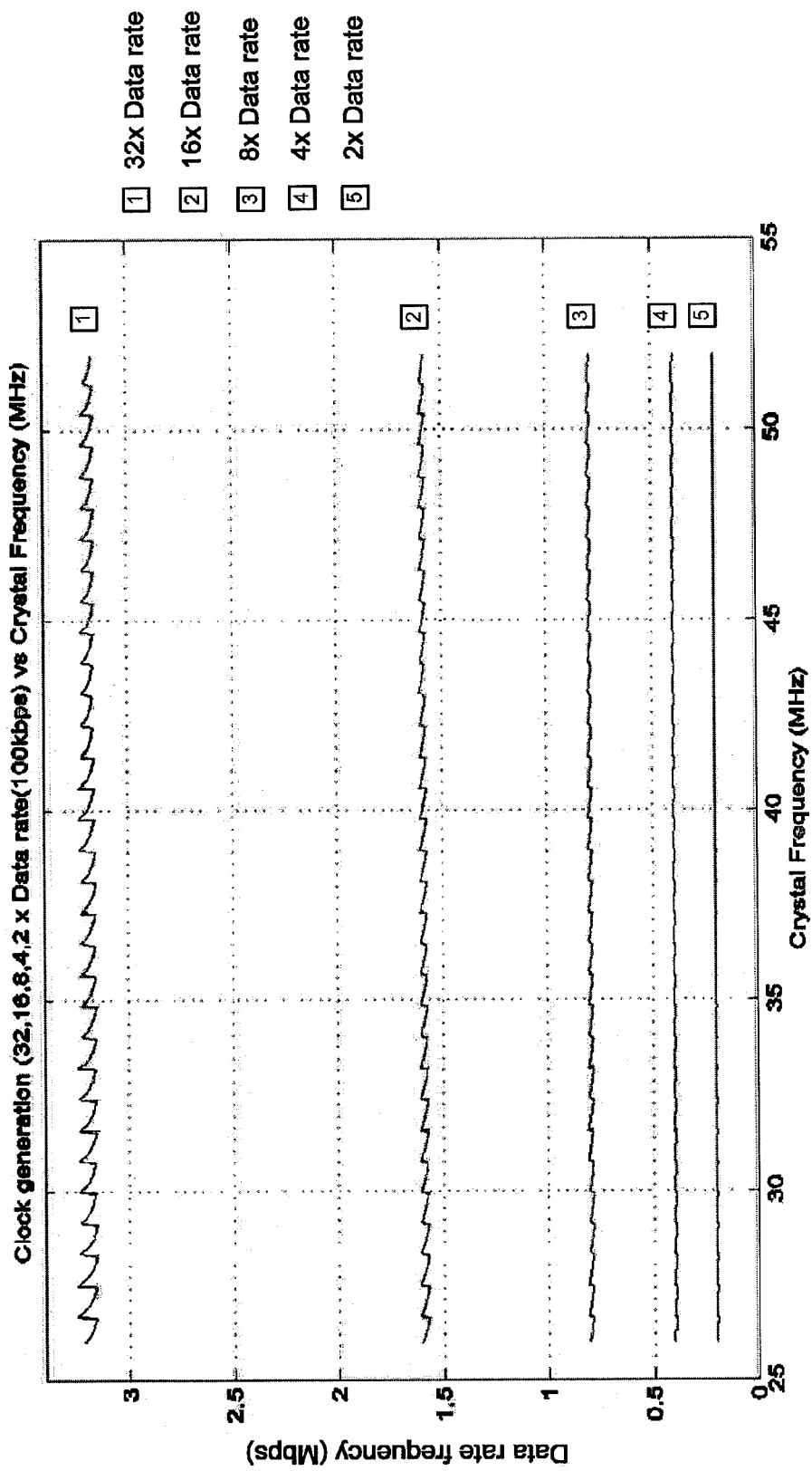
FIG. 6 is a graph illustrating performance of an example clock generation system according to one embodiment.

Referring to FIG. 6, a graph illustrating performance of an example clock generation system will be described below. The graph has input crystal frequency ranging from 25 MHz to 55 MHz on the horizontal or x-axis, and multiples of data rate frequencies in megabits per second (Mbps) on the vertical or y-axis. The graph illustrates generation of multiple clock signals as disclosed herein based on the data rate of 0.1 Mbps. For instance, based on a data rate of 0.1 Mbps, the clock signals of 3.2 Mbps (32 times the data rate), 1.6 Mbps (16 times the data rate), 0.8 Mbps (8 times the data rate), 0.4 Mbps (4 times the data rate), and 0.2 Mbps (2 times the data rate) can be generated with a range of input crystal frequencies. Certain combinations of crystal frequencies and data rates may produce more or less accurate multiples of data rates as shown in the "32×Data rate" line in FIG. 6 since the clock generation may involve discarding fractional bits when the data rate is divided by the crystal frequency. The accuracy of the multiples of data rates may be improved by adding more resolution to the fractional bits, for example.

Figure 7:
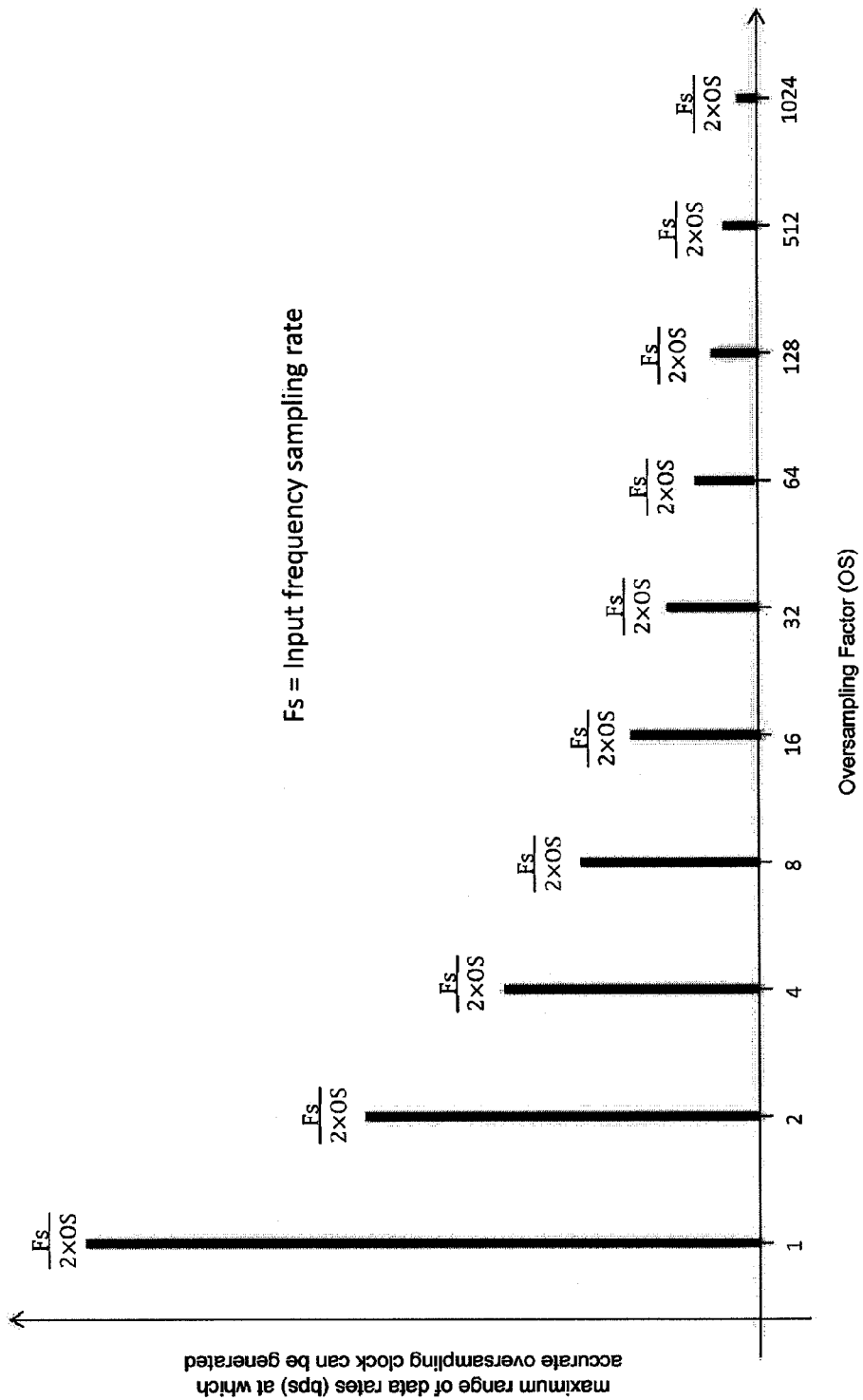
FIG. 7 is a graph illustrating ranges of frequencies generated by an example clock generation system according to one embodiment.

Referring to FIG. 7, a graph illustrating ranges of frequencies generated by an example clock generation system will be described below. The graph in FIG. 7 illustrates maximum frequency that can be generated in relation to an input clock frequency. Fs in FIG. 7 is an input frequency sampling rate, which can be, for example, a crystal frequency such as 26 MHz in the examples discussed above. The x-axis of the graph in FIG. 7 shows various oversampling factors (OS) that may be used in a system implementing clock and data recovery, for example. The y-axis of the graph in FIG. 7 shows the maximum range of data rates in bps at which an accurate oversampling clock can be generated based on the clock generation system disclosed herein. As illustrated in FIG. 7, for a given OS and Fs, a range of data rates ranging up to Fs/(2×OS) can be used to generate an oversampling clock without compromising accuracy according to the disclosure herein. For example, if Fs is 26 MHz and the clock and data recovery is performed at 32 times the data rate (i.e., OS of 32), the maximum data rate for generating an accurate oversampling clock is 406.25 kHz.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

Furthermore, the disclosed methods, systems, and/or apparatus can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus comprising:
a dithering circuit configured to generate a tuning word based on a first clock frequency from a first clock signal, wherein the first clock signal is generated from a clock and data recovery (CDR) system, wherein the tuning word comprises a multi-bit word, wherein the dithering circuit is configured to repeatedly switch between a first value and a second value to generate the tuning word, and wherein the dithering circuit is configured to switch at the first clock frequency from the first clock signal; and
an accumulator configured to accumulate the tuning word with a previous accumulator output value to generate a new accumulator output value at a second clock frequency from a second clock signal.

2. The apparatus of claim 1, further comprising at least one logic circuit configured to generate a plurality of clock signals respectively based on a plurality of different bit values of the new accumulator output value.

3. The apparatus of claim 2, further comprising a transmitter module and/or a receiver module configured to receive the plurality of clock signals.

4. The apparatus of claim 1, further comprising a resetting circuit configured to reset the accumulator based in part on the new accumulator output value.

5. The apparatus of claim 1, wherein the tuning word is generated based in part on an effective data rate value, and wherein the effective data rate value is generated by a processor based on the data rate of the CDR system and a scaling factor.

6. The apparatus of claim 5, wherein the CDR system comprises one or more data rate correcting modules configured to adjust the data rate.

7. The apparatus of claim 1, wherein the new accumulator output value is further based on a programmable modulus.

8. The apparatus of claim 1, wherein the second clock signal is generated from a crystal oscillator.

9. A method for clock generation comprising:
generating a first clock signal;
receiving a second clock signal;
switching repeatedly between a first value and a second value to generate a tuning word, wherein the switching occurs at a first clock frequency from the first clock signal, wherein the tuning word comprises a multi-bit word; and
accumulating the tuning word to a previous accumulator output value to generate a new accumulator output value at a second clock frequency from the second clock signal.

10. The method of claim 9, further comprising generating a plurality of clock signals respectively based on a plurality of different bit values of the new accumulator output value.

11. The method of claim 10, further comprising sending the plurality of clock signals to a transmitter module and/or a receiver module.

12. The method of claim 9, further comprising resetting the accumulator based in part on the new accumulator output value.

13. The method of claim 9, wherein the tuning word is generated based in part on an effective data rate value, and wherein the effective data rate value is generated by a processor based on a data rate of a clock and data recovery (CDR) system and a scaling factor.

14. The method of claim 13, further comprising adjusting the data rate with one or more data rate correcting modules.

15. The method of claim 9, wherein the new accumulator output value is further based on a programmable modulus.

16. An apparatus for clock generation, the apparatus comprising:
 a means for generating a first clock signal;
 a means for switching repeatedly between a first value and a second value to generate a tuning word, wherein the switching occurs at a first clock frequency from the first clock signal, wherein the tuning word comprises a multi-bit word; and
 a means for accumulating the tuning word to a previous accumulator output value to generate a new accumulator output value at a second clock frequency from a second clock signal.

17. The apparatus of claim 16, further comprising a means for generating a plurality of clock signals respectively based on a plurality of different bit values of the new accumulator output value.

18. The apparatus of claim 16, further comprising a means for resetting the accumulator based in part on the new accumulator output value.

19. The apparatus of claim 16, wherein the tuning word is generated based in part on an effective data rate value, and wherein the effective data rate value is generated by a processor based on a data rate of a clock and data recovery (CDR) system and a scaling factor.

20. The apparatus of claim 19, further comprising a means for adjusting the data rate with one or more data rate correcting modules.

21. The apparatus of claim 16, wherein the new accumulator output value is further based on a programmable modulus.

* * * * *

UNITED STATES PATENT AND TRADEMARK OFFICE
CERTIFICATE OF CORRECTION

PATENT NO. : 9,749,125 B2
APPLICATION NO. : 14/568818
DATED : August 29, 2017
INVENTOR(S) : Muhammad Kalimuddin Khan Page 1 of 1

It is certified that error appears in the above-identified patent and that said Letters Patent is hereby corrected as shown below:

In Column 12 at Line 44, In Claim 5, change "the" to --a--.

Signed and Sealed this
Ninth Day of January, 2018

Joseph Matal
*Performing the Functions and Duties of the*
*Under Secretary of Commerce for Intellectual Property and*
*Director of the United States Patent and Trademark Office*